United States Patent
Chen et al.

(10) Patent No.: US 10,082,740 B2
(45) Date of Patent: Sep. 25, 2018

(54) FEEDBACK CONTROL SYSTEM OF AN ALIGNMENT SYSTEM

(71) Applicant: ASML Holding N.V., Veldhoven (NL)

(72) Inventors: Tao Chen, Wilton, CT (US); King Pui Leung, Wilton, CT (US); Kevin J. Violette, Wilton, CT (US)

(73) Assignee: ASML Holding N.V., Veldhoven (NL)

(*) Notice: Subject to any disclaimer, the term of this patent is extended or adjusted under 35 U.S.C. 154(b) by 0 days.

(21) Appl. No.: 15/540,595

(22) PCT Filed: Nov. 26, 2015

(86) PCT No.: PCT/EP2015/077711
§ 371 (c)(1),
(2) Date: Jun. 29, 2017

(87) PCT Pub. No.: WO2016/107706
PCT Pub. Date: Jul. 7, 2016

(65) Prior Publication Data
US 2017/0357166 A1 Dec. 14, 2017

Related U.S. Application Data

(60) Provisional application No. 62/097,210, filed on Dec. 29, 2014.

(51) Int. Cl.
*G03B 27/42* (2006.01)
*G03B 27/54* (2006.01)
(Continued)

(52) U.S. Cl.
CPC ........ *G03F 9/7065* (2013.01); *G03F 7/70141* (2013.01); *G03F 7/70575* (2013.01)

(58) Field of Classification Search
CPC ............ G03F 7/70141; G03F 7/70191; G03F 7/70525; G03F 7/70533; G03F 7/70575; G03F 9/7065
(Continued)

(56) References Cited

U.S. PATENT DOCUMENTS 5,373,515 A * 12/1994 Wakabayashi .......... H01S 3/137
356/519
7,570,358 B2     8/2009 Den Boef
(Continued)

FOREIGN PATENT DOCUMENTS

CN     101750058 A     6/2010
CN     102087479 A     6/2011
(Continued)

OTHER PUBLICATIONS

International Search Report and Written Opinion directed to International Patent Application No. PCT/EP2015/077711, dated May 30, 2016; 10 pages.
(Continued)

*Primary Examiner* — Christina Riddle
(74) *Attorney, Agent, or Firm* — Stern, Kessler, Goldstein & Fox P.L.L.C.

(57) ABSTRACT

An alignment system having long term stability in illumination center wavelength is discussed. The alignment system includes a tunable radiation source and a feedback control system. The tunable radiation source includes a light source configured to provide a broadband radiation beam and a tunable multi-passband filter configured to filter the broadband radiation beam into narrow band radiation beam having a center wavelength value. The feedback control system is configured to measure the center wavelength value of the narrow band radiation beam and compare the measured center wavelength value with a desired center wave- (Continued)

length value. The feedback control system is further configured to generate a control signal based on the comparison in response to a difference being present between the measured center wavelength value and the desired center wavelength value and tune the tunable filter based on the control signal to eliminate or substantially reduce the difference.

20 Claims, 7 Drawing Sheets

(51) Int. Cl.
  *G03F 9/00* (2006.01)
  *G03F 7/20* (2006.01)
(58) Field of Classification Search
  USPC .......... 355/52, 53, 5, 67–71, 72, 75, 77; 356/399–401; 250/492.1, 492.2, 492.22, 250/548; 362/293
  See application file for complete search history.

(56) References Cited

U.S. PATENT DOCUMENTS

| | | | |
|---|---|---|---|
| 8,368,900 | B2 | 2/2013 | Kawasaki et al. |
| 8,781,213 | B2 | 7/2014 | Hsieh et al. |
| 2008/0239265 | A1 | 10/2008 | Den Boef |
| 2009/0097008 | A1 | 4/2009 | Mos et al. |
| 2011/0085726 | A1 | 4/2011 | Den Boef et al. |

FOREIGN PATENT DOCUMENTS

| | | |
|---|---|---|
| EP | 2048542 A2 | 4/2009 |
| JP | S64-022086 A | 1/1989 |
| JP | S64-057773 A | 3/1989 |
| JP | H03-157917 A | 7/1991 |
| JP | H07-183203 A | 7/1995 |
| JP | 2000-323381 A | 11/2000 |
| JP | 2010-038558 A | 2/2010 |
| TW | 200931208 A | 7/2009 |
| TW | 201104727 A | 2/2011 |
| WO | WO 2016/107706 A1 | 7/2016 |

OTHER PUBLICATIONS

International Preliminary Report on Patentability and Written Opinion of the International Searching Authority directed to related International Patent Application No. PCT/EP2015/077711, dated Jul. 4, 2017; 6 pages.

Japanese Notification of Reasons for Refusal with English-language translation attached from related Japanese Patent Publication No. JP 2018-503872 A, dated Jun. 19, 2018; 9 pages.

\* cited by examiner

FEEDBACK CONTROL SYSTEM OF AN ALIGNMENT SYSTEM

CROSS-REFERENCE TO RELATED APPLICATIONS

This application claims priority of U.S. application 62/097,210 which was filed on Dec. 29, 2014 and which is incorporated herein in its entirety by reference.

FIELD

The present disclosure relates to an alignment system that may be used, for example, in a lithographic apparatus.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction. It is also possible to transfer the pattern from the patterning device to the substrate by imprinting the pattern onto the substrate. Another lithographic system is an interferometric lithographic system where there is no patterning device, but rather a light beam is split into two beams, and the two beams are caused to interfere at a target portion of substrate through the use of a reflection system. The interference causes lines to be formed on at the target portion of the substrate.

During lithographic operation, different processing steps may require different layers to be sequentially formed on the substrate. Accordingly, it may be necessary to position the substrate relative to prior patterns formed thereon with a high degree of accuracy. Generally, alignment marks are placed on the substrate to be aligned and are located with reference to a second object. Lithographic apparatus may use an alignment system for detecting positions of the alignment marks and for aligning the substrate using the alignment marks to ensure accurate exposure from a mask.

Alignment systems typically have their own illumination system. The signal detected from the illuminated alignment marks may be dependent on how well the wavelengths of the illumination system are matched to the physical or optical characteristics of the alignment marks, or physical or optical characteristics of materials in contact with or adjacent to the alignment marks. The aforementioned characteristics may vary depending on the processing steps used. Alignment systems may offer a narrow band radiation beam having a set of discrete, relatively narrow passbands in order to maximize the quality and intensity of alignment mark signals detected by the alignment system.

Alignment systems are usually configured for optimal performance at a desired center wavelength (CWL) value of the one or more narrow passbands of the narrow band radiation beam filtered from a broad band radiation beam and output by the illumination system. However, the actual CWL values of the one or more narrow passbands incident on the alignment marks may be different from the desired CWL values. The shift of the actual CWL values from the desired CWL values may be due to, for example, mechanical disturbances to the illumination system, degradation of illumination system components with time, replacement of one or more components of the illumination system, and/or thermal effects from the operation of the lithographic apparatus. This shift in the CWL values may result in inaccurate alignment measurements of the alignment system.

SUMMARY

Accordingly, there is a need for improving long term accuracy and stability of alignment measurements in an alignment system.

According to an embodiment, an alignment system includes a tunable radiation source and a feedback control system. The tunable radiation source may include a light source configured to provide a broadband radiation beam and a tunable filter configured to filter the broadband radiation beam into narrow band radiation beam comprising a CWL value. The feedback control system may be configured to measure the CWL value of the narrow band radiation beam, compare the measured CWL value with a desired CWL value, generate a control signal based on the comparison in response to a difference being present between the measured CWL value and the desired CWL value, and tune the tunable filter based on the control signal to eliminate or substantially reduce the difference.

In another embodiment, a method includes filtering, using a tunable filter, a broadband radiation beam into a narrow band radiation beam. The method further includes measuring, using an analyzer, a CWL value of the narrow band radiation beam, comparing, using the analyzer, the measured CWL value with a desired CWL value, generating, using the analyzer, a control signal based on the comparison in response to a difference being present between the measured CWL value and the desired value, and adjusting, using the tunable filter, a driving signal based on the control signal to eliminate or substantially reduce the difference.

Yet in another embodiment, a lithographic apparatus includes an illumination optical system configured to illuminate a pattern of a patterning device, a projection system configured to project an image of the pattern on to a target portion of a substrate, and an alignment system. The alignment system includes a tunable radiation source and a feedback control system. The tunable radiation source may include a light source configured to provide a broadband radiation beam and a tunable filter configured to filter the broadband radiation beam into narrow band radiation beam comprising a CWL value. The feedback control system may be configured to measure the CWL value of the narrow band radiation beam, compare the measured CWL value with a desired CWL value, generate a control signal based on the comparison in response to a difference being present between the measured CWL value and the desired CWL value, and tune the tunable filter based on the control signal to eliminate or substantially reduce the difference.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1A:
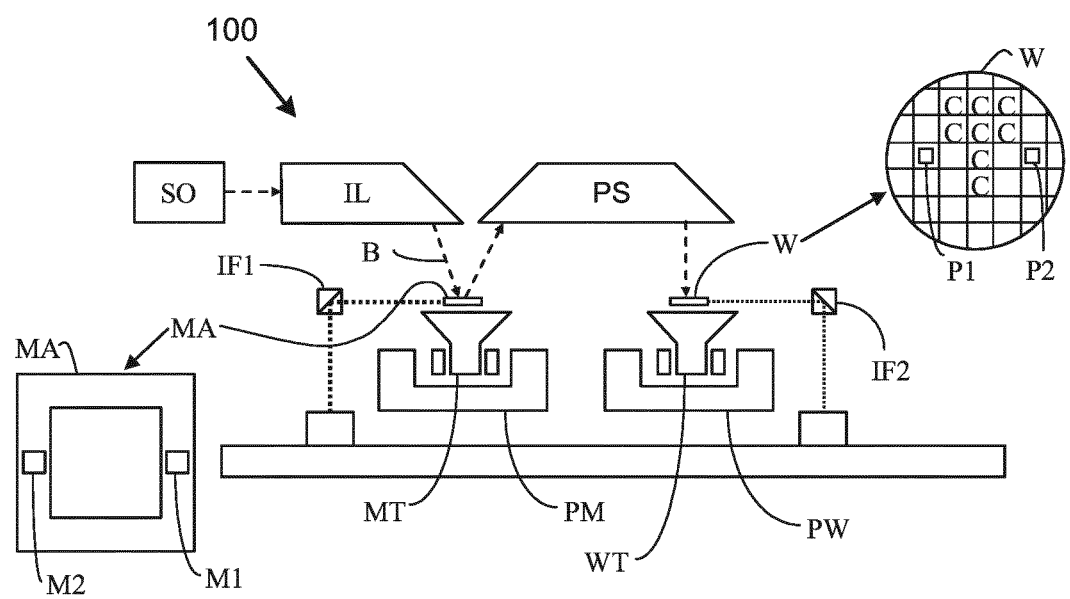
FIG. 1A is a schematic illustration of a reflective lithographic apparatus according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number. Unless otherwise indicated, the drawings provided throughout the disclosure should not be interpreted as to-scale drawings.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing such embodiments in more detail, however, it is instructive to present an example environment in which embodiments of the present invention may be implemented.

Example Reflective and Transmissive Lithographic Systems

Figure 1B:
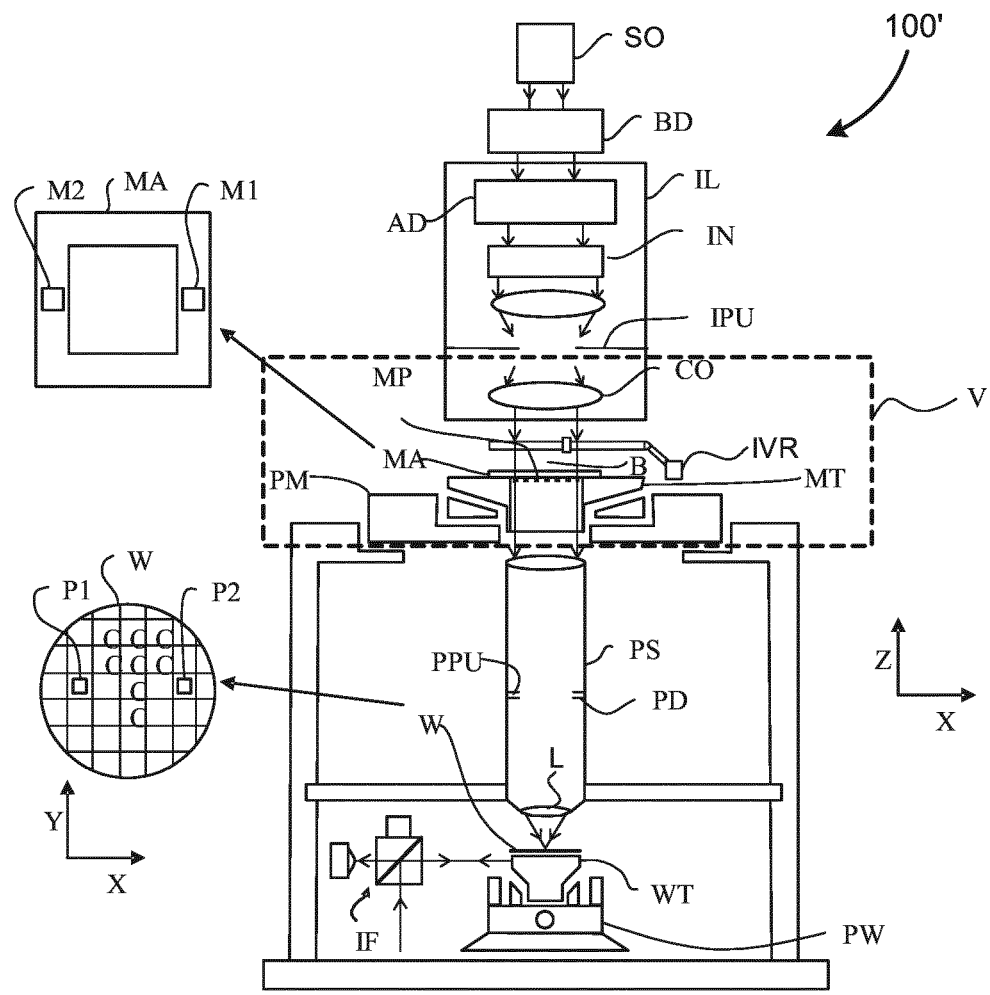
FIG. 1B is a schematic illustration of a transmissive lithographic apparatus according to an embodiment of the invention.

FIGS. 1A and 1B are schematic illustrations of a lithographic apparatus 100 and lithographic apparatus 100', respectively, in which embodiments of the present invention may be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

Referring to FIGS. 1A and 1B, the illuminator IL receives a radiation beam from a radiation source SO. The source SO and the lithographic apparatus 100, 100' can be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatus 100, 100'— for example when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil PPU conjugate to an illumination system pupil IPU. Portions of radiation emanate from the intensity distribution at the illumination system pupil IPU and traverse a mask pattern without being affected by diffraction at a mask pattern and create an image of the intensity distribution at the illumination system pupil IPU.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.
2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
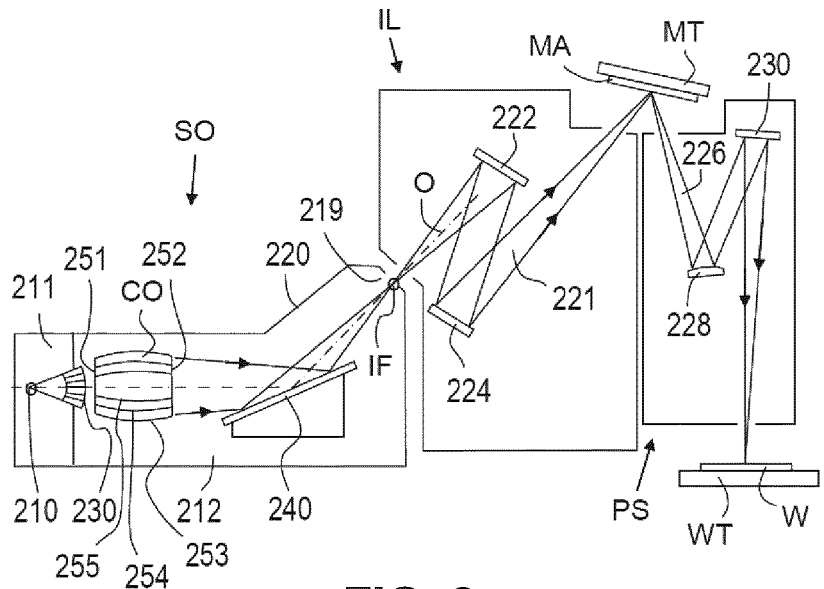
FIG. 2 is a more detailed schematic illustration of the reflective lithographic apparatus, according to an embodiment of the invention.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a facetted field mirror device 222 and a facetted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 230 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the FIGs., for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Example Lithographic Cell

Figure 3:
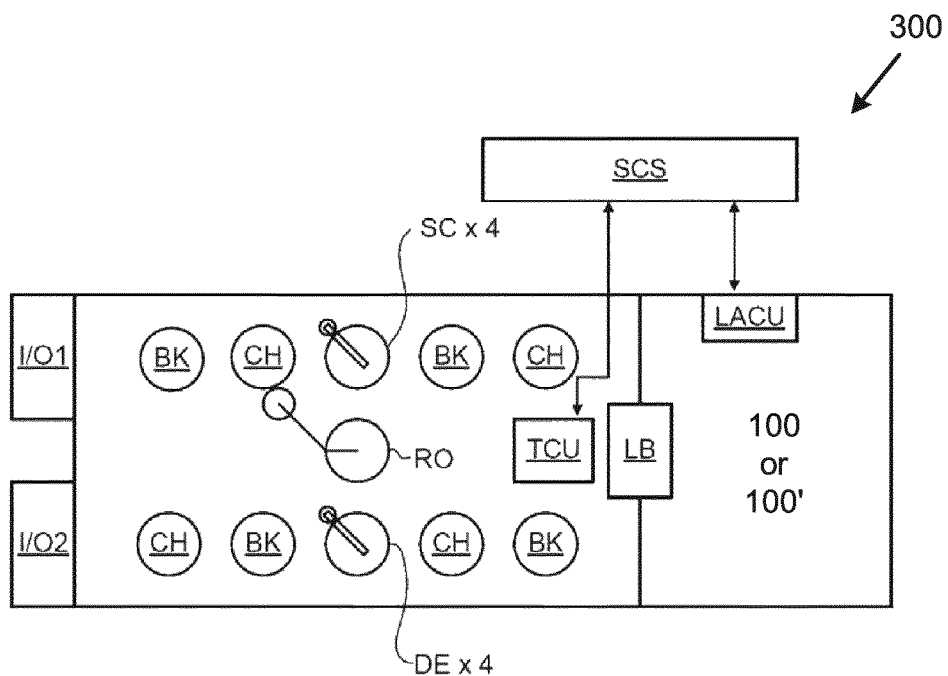
FIG. 3 is a schematic illustration of a lithographic cell, according to an embodiment of the invention.

FIG. 3 shows a lithographic cell 300, also sometimes referred to a lithocell or cluster. Lithographic apparatus 100 or 100' may form part of lithographic cell 300. Lithographic cell 300 may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Alignment System According to an Embodiment

Figure 4:
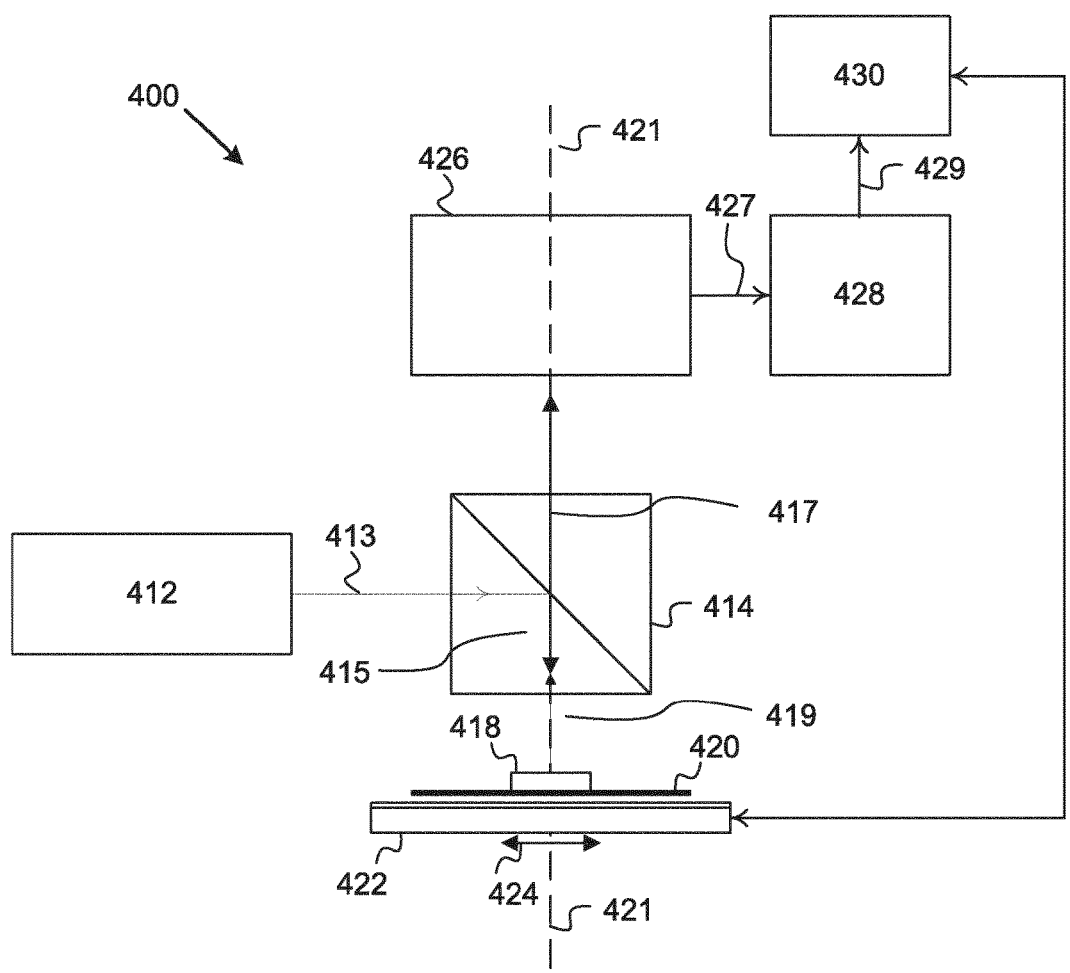
FIG. 4 is a schematic illustration of an alignment system, according to an embodiment of the invention.

FIG. 4 illustrates a schematic of a cross-sectional view of an alignment system 400 that can be implemented as a part of lithographic apparatus 100 or 100', according to an embodiment. In an example of this embodiment, alignment system 400 may be configured to align a substrate (e.g., substrate W) with respect to a patterning device (e.g., patterning device MA). Alignment system 400 may be further configured to detect positions of alignment marks on the substrate and to align the substrate with respect to the patterning device or other components of lithography apparatus 100 or 100' using the detected positions of the alignment marks. Such alignment of the substrate may ensure accurate exposure of one or more patterns on the substrate.

According to an embodiment, alignment system 400 may include an illumination system 412, a beam splitter 414, an image rotation interferometer 426, a detector 428, and an analyzer 430, according to an example of this embodiment. Illumination system may be configured to provide an electromagnetic narrow band radiation beam 413 having one or more passbands. In an example, the one or more passbands may be within a spectrum of wavelengths between about 500 nm to about 900 nm. In another example, the one or more passbands may be discrete narrow passbands within a spectrum of wavelengths between about 500 nm to about 900 nm. Illumination system 412 may be further configured to provide one or more passbands having substantially constant CWL values over a long period of time (e.g., over a lifetime of illumination system 412). Such configuration of illumination system 412 may help to prevent the shift of the actual CWL values from the desired CWL values, as discussed above, in current alignment systems. And, as a result, improve long-term stability and accuracy of alignment systems (e.g., alignment system 400) compared to the current alignment systems.

Beam splitter 414 may be configured to receive radiation beam 413 and split radiation beam 413 into at least two radiation sub-beams, according an embodiment. In an example, radiation beam 413 may be split into radiation sub-beams 415 and 417, as shown in FIG. 4. Beam splitter 414 may be further configured to direct radiation sub-beam 415 onto a substrate 420 placed on a stage 422 moveable along direction 424. Radiation sub-beam 415 may be configured to illuminate an alignment mark or a target 418 located on substrate 420. Alignment mark or target 418 may be coated with a radiation sensitive film in an example of this embodiment. In another example, alignment mark or target 418 may have one hundred and eighty degree symmetry. That is, when alignment mark or target 418 is rotated one hundred and eighty degrees about an axis of symmetry perpendicular to a plane of alignment mark or target 418, rotated alignment mark or target 418 may be substantially identical to an unrotated alignment mark or target 418.

As illustrated in FIG. 4, image rotation interferometer 426 may be configured to receive radiation sub-beam 417 and diffracted radiation beam 419 through beam splitter 414. In an example embodiment, diffracted radiation beam 419 may be at least a portion of radiation sub-beam 415 that may be reflected from alignment mark or target 418. In an example of this embodiment, image rotation interferometer 426 comprise any appropriate set of optical-elements, for example, a combination of prisms that may be configured to form two images of alignment mark or target 418 based on the received reflected radiation beam 419. It should be appreciated that a good quality image need not be formed, but that the features of alignment mark 418 should be resolved. Image rotation device 426 may be further configured to rotate one of the two images with respect to the other of the two images one hundred and eighty degrees and recombine the rotated and unrotated images interferometrically.

In an embodiment, detector 428 may be configured to receive the recombined image and detect an interference as a result of the recombined image when alignment axis 421 of alignment system 400 passes through a center of symmetry (not shown) of alignment mark or target 418. Such interference may be due to alignment mark or target 418 being one hundred and eighty degree symmetrical, and the recombined image interfering constructively or destructively, according to an example embodiment. Based on the detected interference, detector 428 may be further configured to determine a position of the center of symmetry of alignment mark or target 418 and consequently, detect a position of substrate 420. According to an example, alignment axis 421 may be aligned with an optical beam perpendicular to substrate 420 and passing through a center of image rotation interferometer 426.

In a further embodiment, analyzer 430 may be configured to receive signal 429 including information of the determined center of symmetry. Analyzer 430 may be further configured to determine a position of stage 422 and correlate the position of stage 422 with the position of the center of symmetry of alignment mark or target 418. As such, the position of alignment mark or target 418 and consequently, the position of substrate 420 may be accurately known with reference to stage 422. Alternatively, analyser 430 may be configured to determine a position of alignment system 400 or any other reference element such that the center of symmetry of alignment mark or target 418 may be known with reference to alignment system 400 or any other reference element.

It should be noted that even though a beam splitter 414 is shown to direct radiation beam 415 towards alignment mark or target 418 and to direct reflected radiation beam 419 towards image rotation interferometer 426, the disclosure is not so limiting. It would be apparent to a person skilled in the relevant art that other optical arrangements may be used to obtain the similar result of illuminating alignment mark or target 418 on substrate 420 and detecting an image of alignment mark or target 418.

Illumination System According to a First Embodiment

Figure 5:
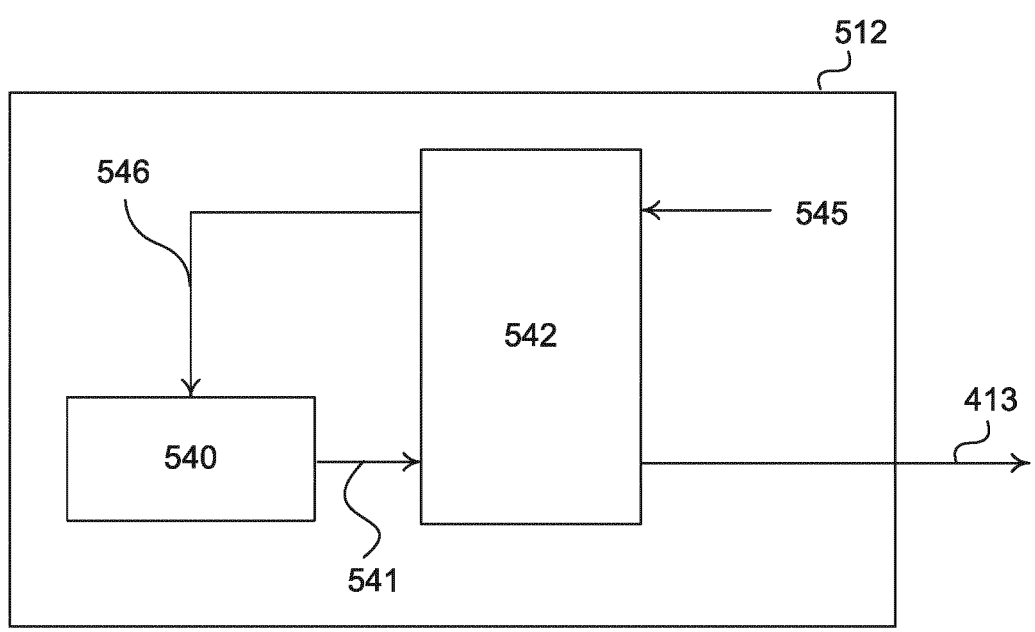
FIGS. 5-6 are schematic illustrations of illumination systems of alignment systems, according to various embodiments of the invention.

FIG. 5 illustrates a schematic of a cross-sectional view of an illumination system 512, according to an embodiment. Illumination system 512 may represent an example embodiment of illumination system 412. According to an embodiment, illumination system 512 may be configured to provide electromagnetic narrow band radiation beam 413 having substantially constant one or more CWL values over a long period of time (e.g., over a lifetime of illumination system 512) and may comprise a tunable radiation source 540 and a feedback control system 542.

Tunable radiation source 540 may be configured to provide electromagnetic narrow band radiation beam 541 having one or more discrete narrow passbands. Each of the one or more discrete narrow passbands may have a desired CWL value and a bandwidth of few nanometers wide (e.g., between about 1 nm to about 12 nm), according to an embodiment. In an example, tunable radiation source 540 may be configured to tune the one or more discrete narrow passbands over a continuous and broad spectrum of wavelengths ranging from about 500 nm to about 900 nm. The tunability of tunable radiation source 540 may be based on tunable filtering of a broadband source, such as an arc lamp or a Supercontinuum source, according to various examples. Such tunability of tunable radiation source 540 may allow selection of wavelengths that fall in spectral gaps between, or outside of, currently available discrete passbands in illumination systems.

Tuning may be accomplished at the lithographic system level in an example embodiment. The desired tunablity may be achieved for a wide range of discrete CWL values by filtering the broadband source along with filters such as acousto-optic tunable filter (AOTF), rugate filter, dielectric and/or holographic filters. Additional filters may be used in conjunction with these filters or a mechanism may be added in tunable radiation source 540 to achieve bandwidth adjustment of the one or more narrow passbands of radiation beam 541.

Tunable radiation source 540 may be further configured to receive one or more control signals 546 to prevent CWL values of the one or more narrow passbands of radiation beam 541 from shifting away from the desired CWL values, according to an example of this embodiment. One or more control signals 546 may include information to correct any shift in the CWL values from the desired CWL values of the one or more narrow passbands. The shift in the CWL values may be corrected to within, for example, less than 1 nm of the desired CWL values.

Feedback control system 542 may be a closed loop control system and may be configured to generate such one or more control signals 546 and provide feedback information through these control signals 546 to tunable radiation source 540, according to an example embodiment. In order to generate controls signals 546, feedback control system 542 may be configured to detect one or more CWL values of radiation beam 541 and compare the detected one or more CWL values to corresponding set points 545. Set points 545 may be received as inputs to feedback control system 542 and each set point of set points 545 may correspond to a CWL value that may be desired for each of the one or more narrow passbands of output radiation beam 413. Based on the comparison of the detected CWL values and set points 545, control signals 546 may be generated if differences found between the detected CWL values and corresponding set points 545. In an example, feedback control system 542 may be configured to tune tunable radiation source 540 by, for example, tuning a tunable filter of tunable radiation source 540 based on control signals 546 to eliminate or substantially reduce the differences found between the detected CWL values and corresponding set points 545. As a result, the CWL values of the one or more narrow passbands of radiation beam 541 may be shifted to the desired CWL values.

Feedback system 542 may be further configured to output radiation beam 413 that may be directed on alignment mark or target (e.g. alignment mark or target 418), according to an example. Radiation beam 413 may represent a portion of radiation beam 541 that may have been feedback controlled through feedback control system 542 to stabilize one or more CWL values of radiation beam 413.

Illumination System According to a Second Embodiment

Figure 6:
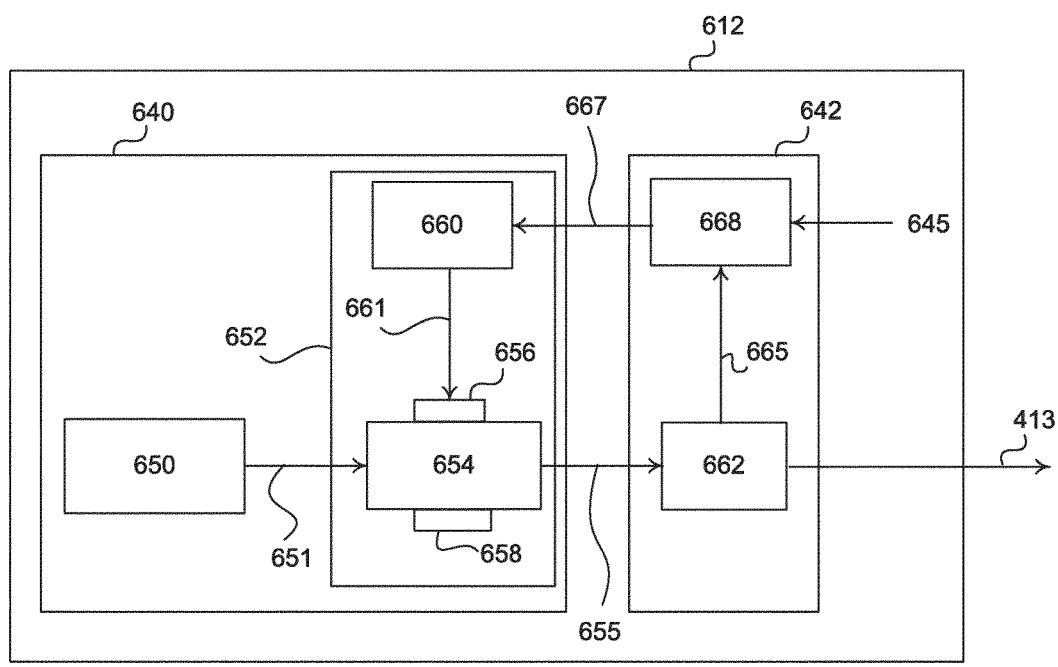

FIG. 6 illustrates a schematic of a cross-sectional view of an illumination system 612, according to an embodiment. Illumination system 612 may represent example embodiments of illumination systems 412 and 512. According to an embodiment, illumination system 612 may be configured to provide electromagnetic narrow band radiation beam 413 having substantially constant one or more CWL values over a long period of time (e.g., over a lifetime of illumination system 612) and may comprise a tunable radiation source 640 and a feedback control system 642. Tunable radiation source 640 may represent an example embodiment of tunable radiation source 540 and feedback control system 642 may represent an example embodiment of feedback control system 542.

According to an embodiment, tunable radiation source 640 may comprise a light source 650 and an AOTF 652. Light source 650 may be a continuous white light source, a laser, amplified stimulated emission (ASE) source, or a broadband source, such as an arc lamp or a Supercontinuum source (e.g., spectrum ranging from about 400 nm to about 2500 nm). Light source 652 may be configured to provide radiation beam 651 that may have a broad band of wavelengths in an example of this embodiment. AOTF 652 may be configured to receive radiation beam 651 and to substantially simultaneously select discrete narrow passbands from the broad band of wavelengths of radiation beam 651. In an example, the AOTF 652 selected discrete narrow passbands may be linearly polarized.

AOTF 652 is a an electronically tunable narrow passband acoustic filter that may be configured to provide multiple simultaneous passband filters and to modulate intensity and wavelength of radiation beam 651. In an example, AOTF 652 may be configured to generate up to eight simultaneous passbands. Thus, AOTF 652 may be capable of selecting or filtering a plurality of passbands, each centered around a different wavelength value, which forms a polychromatic beam. Such polychromatic beam may allow a plurality of alignment measurements to be made substantially simultaneously.

According to an example of this embodiment, AOTF 652 may include an acousto-optic crystal 654, a piezoelectric transducer 656, a high-frequency (e.g., RF frequency) driver circuit 660, and an acoustic absorber 658 that are coupled to each other.

Piezoelectric transducer 656 may be configured to receive one or more high-frequency driver signals 661 substantially simultaneously from driver circuit 660 to drive transducer 656 and may be configured to create acoustic waves in crystal 654 with wavelengths determined by mechanical properties (e.g., speed of sound) of crystal 654 and one or more driver signals 661. As these acoustic waves propagate through crystal 654 they may create a periodic pattern of alternating high/low refractive index in crystal 654. The resulting periodic index modulation may approximate a Bragg diffraction grating, such that one or more narrow passbands are diffracted away from input radiation beam 651 to produce linearly polarized narrow band radiation beam 655.

In an example, each CWL value of the one or more narrow passbands of radiation beam 655 may be dependent on corresponding driving frequency of transducer 656. Each CWL value of the one or more narrow passbands may be individually and substantially simultaneously selected by tuning the corresponding frequency component of one or more driver signals 661. In another example, the intensity of the one or more narrow passbands may be varied as a function of amplitude of driver signals 661.

According to an example of this embodiment, different CWL set points may be dynamically selected by dynamically adjusting different frequency components of driver signals 661. The CWL set points may be selected by various methods, including but not limited to one or more of manual, automatic, or user-assisted. In manual mode, a user may input a CWL set point directly. In automatic mode, such as during a calibration of alignment system, such as alignment system 400, alignment wavelength may be optimized by continuously monitoring alignment signals as a function of illumination wavelength and selecting the CWL set point that maximizes alignment signal quality or meets predetermined specifications by adjusting driver signals 661. In user assisted mode, a user may control one or more parameters, such as driver signals 661, used in the automated process.

In a further embodiment, feedback control system 642 may be configured to monitor and stabilize the one or more CWL values of radiation beam 655 received from AOTF 652. Monitoring and stabilizing the one or more CWL values may help to provide, for example, substantially constant one or more CWL values of output radiation beam 413 to illuminate, for example, alignment mark or target (e.g., alignment mark or target 418) and improve alignment accuracy and reproducibility of alignment systems (e.g., alignment system 400). Feedback control system 642 may be configured to individually and substantially simultaneously monitor and stabilize, e.g., each of the CWL values of the one or more narrow passbands of radiation beam 655, according to an example of this embodiment. Such monitoring and stabilization of radiation beam 655 may be achieved through beam splitter 662 and optical spectrum analyser (OSA) 668 that may be parts of feedback control system 642, according to an example of this embodiment.

Beam splitter 662 may be configured to split radiation beam 655 into radiation beam 413 and sample radiation beam 665 and to direct sample radiation beam 665 towards OSA 668, according to an example. Sample radiation beam 665 may contain optical characteristics similar to radiation beam 655. OSA 668 may be configured to individually and substantially simultaneously measure each of the CWL values of the one or more narrow passbands of sample radiation beam 665, according to an example. In another example, OSA 668 may be configured to individually and substantially simultaneously compare and determine differences between each of the measured CWL values with corresponding set points 645. Set points 645 may be received as inputs to OSA 668. Each set point of set points 645 may correspond to a CWL value that may be desired for each of the one or more narrow passbands of radiation beam 655 and as a result, the CWL values desired for output radiation beam 413 to illuminate, for example, alignment mark or target (e.g., alignment mark or target 418).

OSA 668 may be further configured to generate control signal 667 based on the comparison of the measured CWL values and set points 645. In an example, control signal 667 may be generated if differences exist between the measured CWL values with the corresponding set points 645. Control signal 667 may contain information to individually and substantially simultaneously correct each of these differences. This correction may be done by providing control signal 667 to driver circuit 660 that adjusts driver signals 661, and consequently, adjusts the driving frequencies of transducer 656 to filter passbands centered around the desired wavelengths. For example, if a measured CWL value is found to be higher than a desired CWL value, control signal 667 may contain information to reduce the driving frequency of transducer 656 by an amount that may be needed to eliminate or substantially reduce the difference between the measured CWL value and the desired CWL value. This feedback control of radiation beam 655 may be performed continuously and in real time during, for example, a lithographic operation to ensure stability of the one or more CWL values of output radiation beam 413.

It should be noted that even though a beam splitter 662 is shown to direct radiation beams 413 and 665, the disclosure is not so limiting. It would be apparent to a person skilled in the relevant art that other optical arrangements may be used to direct radiation beams 413 and 665.

Figure 7:
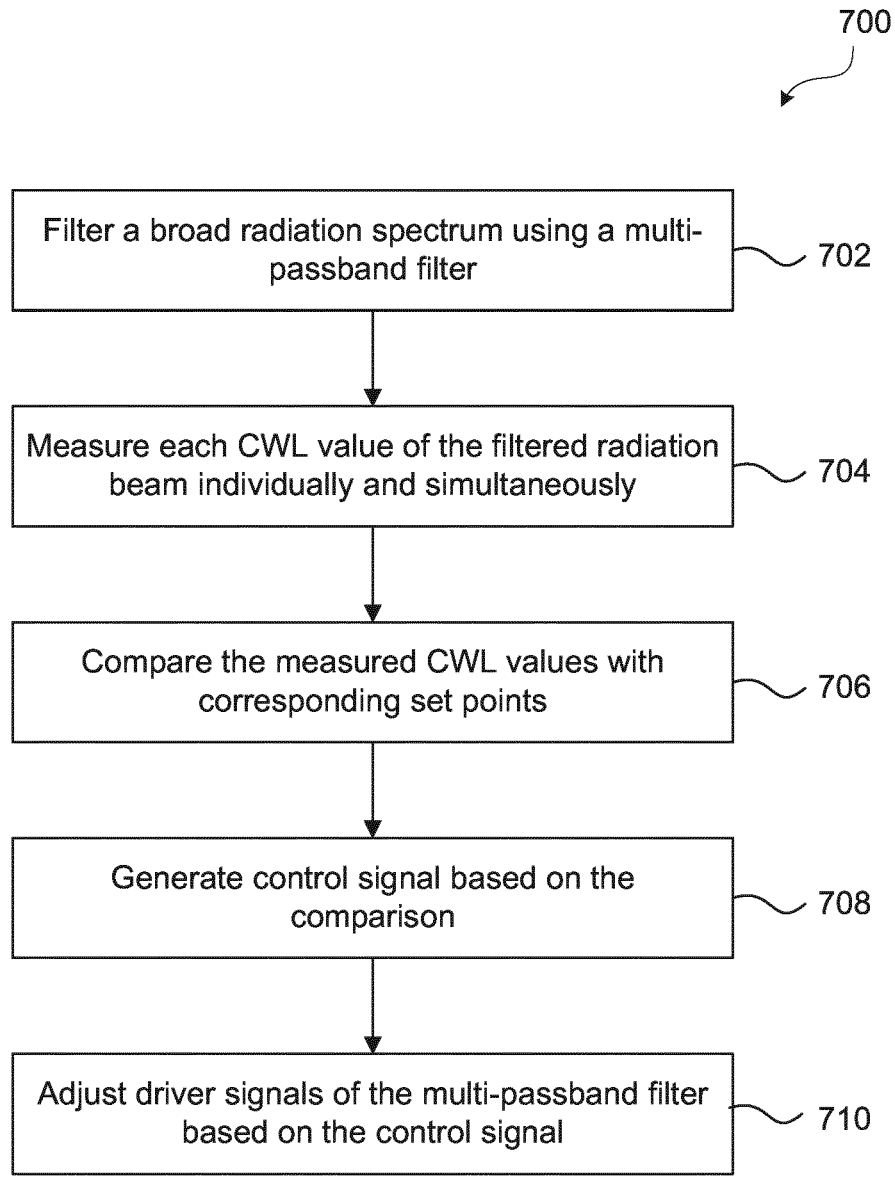
FIG. 7 is a flowchart for feedback control of a CWL of a radiation beam of an illumination system, according to an embodiment of the invention.

Example Steps for Monitoring and Controlling CWLs of a Radiation Beam in an Alignment System FIG. 7 illustrates a flowchart 700 for feedback control of CWLs of a radiation beam for an alignment system according to an embodiment. Solely for illustrative purposes, the steps illustrated in FIG. 7 will be described with reference to example operating environment illustrated in FIGS. 1-6. However, flowchart 700 is not limited to these embodiments. It is to be appreciated that steps can be performed in a different order or not performed depending on specific applications.

In step 702, a broad and flat radiation spectrum is filtered using a multi-passband filter to generate a filtered radiation beam having one or more narrow bands of wavelengths. For example, radiation beam 651 having a flat and broad band of wavelengths may be filtered using AOTF 652 to generate narrow band radiation beam 655 having one or more narrow passbands that may be linearly polarized.

In step 704, each CWL value of a portion of the filtered radiation beam is measured individually and substantially simultaneously. For example, each CWL value of sample radiation beam 665 may be measured individually and substantially simultaneously by OSA 668.

In step 706, the measured CWL values are compared with corresponding set points. For example, the measured CWL values may be compared with set points 645 using OSA 668.

In step 708, a control signal is generated based on the comparison. For example, control signal 667 may be generated by OSA 668 based on the comparison.

In step 710, driver signals of the multi-passband filter are adjusted based on the control signal to eliminate or substantially reduce differences between the measured CWL values and the corresponding set points. For example, driver signals 661 may be adjusted based on control signal 667 provided to driver circuit 660 of AOTF 652 to eliminate or substantially reduce differences between the measured CWL values of sample radiation beam 665 and the corresponding set points 645.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present specification is to be interpreted by those skilled in relevant art(s) in light of the teachings herein.

In the embodiments described herein, the terms "lens" and "lens element," where the context allows, can refer to any one or combination of various types of optical components, including refractive, reflective, magnetic, electromagnetic, and electrostatic optical components.

Further, the terms "radiation" and "beam" used herein encompass all types of electromagnetic radiation, including ultraviolet (UV) radiation (for example, having a wavelength λ of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 400 to about 700 nm is considered visible radiation; radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

The term "substrate" as used herein generally describes a material onto which subsequent material layers are added. In embodiments, the substrate itself may be patterned and materials added on top of it may also be patterned, or may remain without patterning.

The term "in substantial contact" as used herein generally describes elements or structures that are in physical contact with each other with only a slight separation from each other which typically results from misalignment tolerances. It should be understood that relative spatial descriptions between one or more particular features, structures, or characteristics (e.g., "vertically aligned," "substantial contact," etc.) used herein are for purposes of illustration only, and that practical implementations of the structures described herein may include misalignment tolerances without departing from the spirit and scope of the present disclosure.

The term "optically coupled" as used herein generally refers to one coupled element being configured to impart light to another coupled element directly or indirectly.

The term "optical material" as used herein generally refers to a material that allows light or optical energy to propagate therein or therethrough.

The term "center wavelength" as used herein generally refers to a midpoint value between a band of wavelengths at a full width half maximum (FWHM) of a passband.

The term "FWHM of a passband" as used herein generally refers to a band of wavelengths at which optical transmission is 50% of the optical transmission at a peak wavelength of the passband.

The term "passband" as referred herein may be defined as a band of wavelengths that are passed through a filter.

While specific embodiments of the invention have been described above, it will be appreciated that the invention may be practiced otherwise than as described. The description is not intended to limit the invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

The breadth and scope of the present invention should not be limited by any of the above-described exemplary embodiments, but should be defined only in accordance with the following claims and their equivalents.

What is claimed is:

1. An alignment system comprising:
    a tunable radiation source comprising:
        a light source configured to provide a broadband radiation beam, and
        a tunable filter configured to filter the broadband radiation beam into a narrow band radiation beam comprising a center wavelength (CWL) value; and
    a feedback control system configured to:
        measure the CWL value of the narrow band radiation beam;
        compare the measured CWL value with a desired CWL value;
        generate a control signal based on the comparison in response to a difference being present between the measured CWL value and the desired CWL value; and
        tune the tunable filter based on the control signal to eliminate or substantially reduce the difference,
        wherein the narrow band radiation beam comprises narrow passbands, and
        wherein the feedback control system is configured to individually and substantially simultaneously measure or compare a CWL value of each narrow passband.

2. The alignment system of claim 1, wherein the feedback control system comprises an optical analyzer configured to:
    measure the CWL value of the narrow band radiation beam;
    compare the measured CWL value with the desired CWL value;
    generate the control signal based on the comparison in response to the difference; and
    tune the tunable filter based on the control signal to eliminate or substantially reduce the difference.

3. The alignment system of claim 1, wherein
    the feedback control system is configured to individually and substantially simultaneously measure a CWL value of each narrow passband of the narrow band radiation beam.

4. The alignment system of claim 1, wherein
    the feedback control system is configured to individually and substantially simultaneously compare a CWL value of each narrow passband of the narrow band radiation beam with a corresponding desired CWL value.

5. The alignment system of claim 1, wherein:
the tunable filter comprises a driver circuit; and
the feedback control system is configured to adjust a driver signal of the driver circuit based on the control signal.

6. The alignment system of claim 1, wherein the feedback control system comprises an optical analyzer configured to:
receive a portion of the narrow band radiation beam; and
measure a CWL value of the portion of the narrow band radiation beam.

7. The alignment system of claim 1, wherein:
the tunable filter comprises a transducer; and
the CWL of the narrow band radiation beam is dependent on a driving frequency of the transducer.

8. The alignment system of claim 1, wherein:
the narrow band radiation beam comprises narrow passbands; and
the tunable filter is configured to select each CWL of the narrow passbands individually and simultaneously.

9. The alignment system of claim 1, wherein the feedback control system is configured to monitor and stabilize the CWL of the narrow band radiation beam in real-time during a lithographic operation.

10. The alignment system of claim 1, wherein the tunable filter is an acousto-optic tunable filter.

11. A method comprising:
filtering, using a tunable filter, a broadband radiation beam into a narrow band radiation beam;
measuring, using an analyzer, a center wavelength (CWL) value of the narrow band radiation beam;
comparing, using the analyzer, the measured CWL value with a desired CWL value;
generating, using the analyzer, a control signal based on the comparison in response to a difference being present between the measured CWL value and the desired value; and
adjusting, using the tunable filter, a driving signal based on the control signal to eliminate or substantially reduce the difference,
wherein the narrow band radiation beam comprises narrow passbands, and
wherein the measuring comprises measuring individually and substantially simultaneously a CWL value of each narrow passband or the comparing comprises comparing individually and substantially simultaneously a CWL value of each narrow passband.

12. The method of claim 11, wherein the measuring comprises:
measuring individually and substantially simultaneously a CWL value of each narrow passband of the narrow band radiation beam.

13. The method of claim 11, wherein the comparing comprises:
comparing individually and substantially simultaneously a CWL value of each narrow passband of the narrow band radiation beam with a corresponding desired CWL value.

14. The method of claim 11, wherein the method is performed in real-time during a lithographic operation.

15. The method of claim 11, further comprising directing, using a beam splitter, a portion of the narrow band radiation beam towards the analyzer.

16. A lithographic apparatus comprising:
an illumination system configured to illuminate a pattern of a patterning device;
a projection system configured to project an image of the pattern on to a target portion of a substrate; and
an alignment system comprising:
a tunable radiation source comprising:
a light source configured to provide a broadband radiation beam, and
a tunable filter configured to filter the broadband radiation beam into a narrow band radiation beam comprising a center wavelength (CWL) value; and
a feedback control system configured to:
measure the CWL value of the narrow band radiation beam;
compare the measured CWL value with a desired CWL value;
generate a control signal based on the comparison in response to a difference being present between the measured CWL value and the desired CWL value; and
tune the tunable filter based on the control signal to eliminate or substantially reduce the difference,
wherein the narrow band radiation beam comprises narrow passbands, and
wherein the feedback control system is configured to individually and substantially simultaneously measure or compare a CWL value of each narrow passband.

17. The lithographic apparatus of claim 16, wherein
the feedback control system is configured to individually and substantially simultaneously measure a CWL value of each narrow passband of the narrow band radiation beam.

18. The lithographic apparatus of claim 16, wherein
the feedback control system is configured to individually and substantially simultaneously compare a CWL value of each narrow passband of the narrow band radiation beam with a corresponding desired CWL value.

19. The lithographic apparatus of claim 16, wherein the feedback control system is configured to monitor and stabilize the CWL of the narrow band radiation beam in real-time during a lithographic operation.

20. The lithographic apparatus of claim 16, wherein:
the tunable filter comprises a driver circuit; and
the feedback control system is configured to adjust a driver signal of the driver circuit based on the control signal.

* * * * *